United States Patent [19]

Yero

[11] Patent Number: 5,469,382
[45] Date of Patent: Nov. 21, 1995

[54] DEVICE FOR DETECTING THE CONTENTS OF CELLS WITHIN A MEMORY, ESPECIALLY AN EPROM MEMORY, METHOD IMPLEMENTED WITH THIS DEVICE, AND MEMORY PROVIDED WITH THIS DEVICE

[75] Inventor: Emilio Yero, Aix En Provence, France

[73] Assignee: SGS-Thomson Microelectronics S.A., Gentilly, France

[21] Appl. No.: 75,524

[22] PCT Filed: Oct. 9, 1992

[86] PCT No.: PCT/FR92/00952

§ 371 Date: Jun. 11, 1993

§ 102(e) Date: Jun. 11, 1993

[87] PCT Pub. No.: WO93/07622

PCT Pub. Date: Apr. 15, 1993

[30] Foreign Application Priority Data

Oct. 11, 1991 [FR] France ................................ 91 12540

[51] Int. Cl.[6] ........................................................ G11C 7/00
[52] U.S. Cl. ..................... 365/185.20; 365/207; 365/208; 327/51
[58] Field of Search ........................... 365/207, 208, 365/185; 307/530; 327/51

[56] References Cited

U.S. PATENT DOCUMENTS

| | | | |
|---|---|---|---|
| 4,004,157 | 1/1977 | Baertsch et al. | 307/530 |
| 4,068,136 | 1/1978 | Minami | 307/530 X |
| 4,151,429 | 4/1979 | Hupé | 307/530 |
| 4,876,517 | 10/1989 | Arcus | 307/530 X |
| 5,293,333 | 3/1994 | Hashimoto | 365/185 |

FOREIGN PATENT DOCUMENTS

| | | |
|---|---|---|
| 0087006 | 8/1983 | European Pat. Off. . |
| 0270750 | 6/1988 | European Pat. Off. . |
| 0359561 | 3/1990 | European Pat. Off. . |
| 0399820 | 11/1990 | European Pat. Off. . |
| 809269 | 2/1981 | U.S.S.R. . |

OTHER PUBLICATIONS

Patent Abstracts of Japan, vol. 4, No. 97, (E–18) Jul. 12, 1980 & JP–A–55061136 (Fujitsu) May 8, 1980.

*Primary Examiner*—Joseph A. Popek
*Assistant Examiner*—Son Dinh
*Attorney, Agent, or Firm*—Wolf, Greenfield & Sacks

[57] ABSTRACT

A device is provided for detecting the content of cells of a memory, and for minimizing the read access time of a high-capacity EPROM memory in which cells are organized as a set of bit rows. A comparator including a differential amplifier compares a reference current from a reference column with a read current invoked in a cell of a bit row. The reference current and a read current flow through a resistive reference element and a resistive read element respectively. These resistive elements are connected, at one end, to a supply voltage source and, at the other end, to the non-inverting input and the inverting input respectively of the differential amplifier. The differential amplifier delivers as output a detection signal. In a preloading period the output of the differential amplifier is connected to its inverting input.

13 Claims, 1 Drawing Sheet

DEVICE FOR DETECTING THE CONTENTS OF CELLS WITHIN A MEMORY, ESPECIALLY AN EPROM MEMORY, METHOD IMPLEMENTED WITH THIS DEVICE, AND MEMORY PROVIDED WITH THIS DEVICE

BACKGROUND OF THE INVENTION

1. Field of the Invention

The present invention relates to a device for detecting the contents of the cells contained in a memory, especially an EPROM memory. It also concerns a method implemented with this device, as well as a memory provided with this device.

2. Discussion of Background Art

Present progress in memories of very high capacities, especially of EPROM type, has been accompanied by an increase in the working frequencies of the systems in which these memories are implemented, and consequently by the search for ever shorter times for access to the contents of the cells constituting these memories. Now, in order to minimize the access time of a memory, especially a memory of EPROM type, it is essential to preset the detection amplifier normally allowed for in order to permit the reading of the contents of each cell in a state in which the differential inputs are balanced.

Hitherto, in the earlier designs of this detection amplifier, this presetting was performed using a pulse to short-circuit the differential inputs directly. However, this has the disadvantage of generating spurious current spikes both in the reference column and in the bit row, this having the consequence of disturbing the state of the current comparator and consequently of leading to an increase in the access time.

SUMMARY OF THE INVENTION

The aim of the invention is to remedy these disadvantages by providing a device for detecting the contents of the cells of a memory, especially an EPROM memory, these cells being organized as a set of bit lines, this device comprising means for comparing a reference current associated with a reference column and a read current invoked in a cell of a bit lines and whose contents are to be read, said comparison means comprising a resistive reference element and a resistive read element through which the reference and read currents respectively travel, and which are connected, on the one hand, to a supply voltage source and, on the other hand, to a non-inverting input and to an inverting input respectively of a differential amplifier delivering as output a detection cue.

According to the invention, the device furthermore comprises means for selectively connecting the output of the differential amplifier to its inverting input for a predetermined preloading period.

Thus, it is the differential stage itself which is used to balance the differential inputs, by passing from a differential mode to a follower mode for a predetermined period. This also has the effect of compensating for the asymmetries which general exist in the input transistors of the differential stage.

Furthermore, since the entire preloading current travels towards the bit line, the reference column is not disturbed by the preloading operation, this having the effect of improving the stability of the reference column during the detection operation.

According to an advantageous embodiment, the selective connecting means comprise switching means controlled by a cyclic preloading clock signal.

According to another aspect of the invention, the method of detecting the contents of cells of a memory, especially of EPROM type, implemented in the device according to the invention, comprising, for each read sequence for a cell, a step of preloading this device, followed by a step of reading the contents of said cell comprising a comparison of the read current flowing in said cell with a reference current, this comparison being made by a differential amplifier, is such that, during the preloading step, the differential amplifier is switched into follower mode during a preloading clock cycle.

According to yet another aspect of the invention, the erasable permanent memory, especially of EPROM type, incorporating devices according to the invention, is such that it comprises control means for generating, in the course of a preloading clock cycle, a signal for controlling the means for selectively connecting the output to the inverting input of the differential amplifier of each of the detection devices.

Other features of the invention will emerge further from the description below.

BRIEF DESCRIPTION OF THE DRAWINGS

In the attached drawings given by way of non-limiting examples.

The detection device according to the invention will now be described in further detail with reference to FIGS. 1 to 3, together with the method implemented in this device.

DETAILED DESCRIPTION

Figure 1:
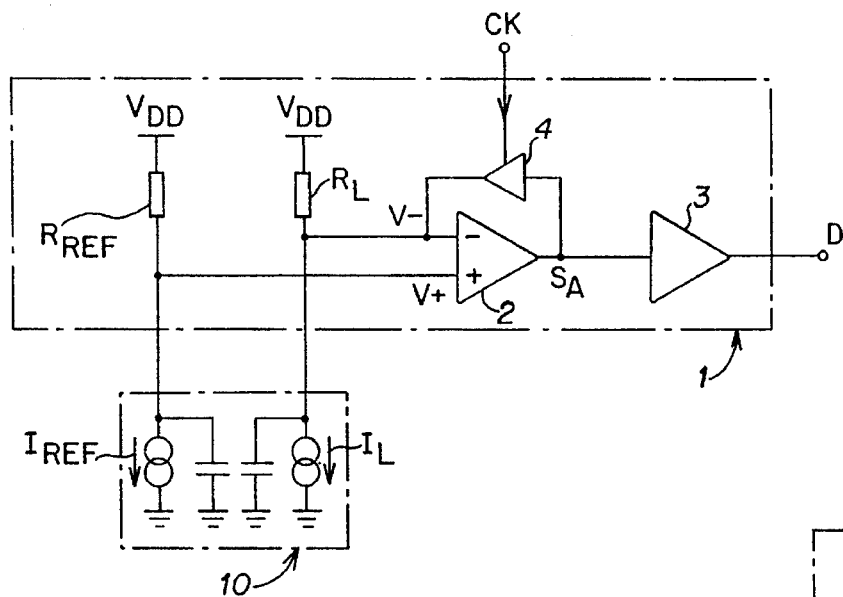
FIG. 1 is a diagrammatic view of a detection device according to the invention.

In the embodiment illustrated in FIG. 1, the detection device according to the invention comprises a differential amplifier 2 mounted in order to compare a reference current $I_{REF}$ invoked in a reference column and represented symbolically by a reference current source, with a read current $I_L$ invoked by a memory cell 10 whose contents are desired to be read accurately and which is modeled in FIG. 1 in the form of a capacitance and a current source. Each reference and read current source is connected respectively to a DC supply voltage source $V_{DD}$ via resistive reference and read elements $R_{REF}$ and $R_L$ respectively, according to techniques which are well known within the area of the manufacture of semiconductors by MOS technology. Moreover, the resistive reference and read elements $R_{REF}$ and $R_L$ are connected to the non-inverting input V+ and inverting input V− respectively of the differential amplifier 2 according to an arrangement which is well known to the expert in the area of electronics. According to the invention, a switch 4 controlled by a clock signal CK selectively connects the output of the differential amplifier 2 to its inverting input V−. The detection signal $S_A$ output by the differential amplifier 2 is applied as input to a high-impedance amplifier 3 which generates a logic cue D representative of the contents of the memory cell read. The detection device 1 according to the invention thus has a three-state logic output which makes possible any interfacing of the memory within a digital system.

Figure 2:
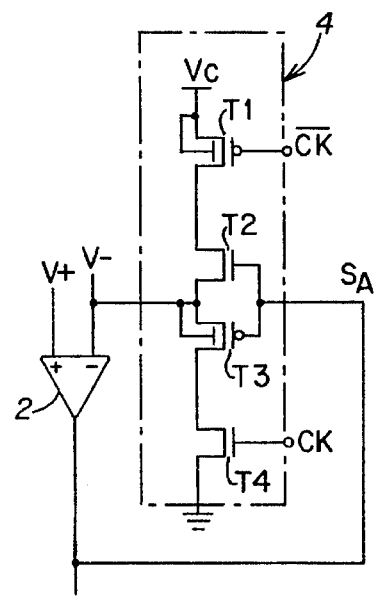
FIG. 2 represents a practical embodiment of selective connecting means implemented in the invention.

With reference to FIG. 2, the switch 4 can be made advantageously, implementing well-known techniques, from four transistors connected in series, a first transistor T1, of PMOS type, having its source connected to a DC voltage source Vc and its drain connected to the drain of a second transistor T2 of NMOS type whose source is connected to the source of a third transisor T3 of PMOS type. A fourth transistor T4 of NMOS type has its source connected to the earth of the device and its drain connected to the drain of the third transistor T3. It should be noted that the transistors T1 and T3 of PMOS type must have their substrate connected to their drain, so as in particular to minimize their threshold voltage.

PMOS transistor means a P-channel MOS transistor and NMOS transistor means an N-channel MOS transistor.

A clock signal CK generated by an outside clock generator (not shown) is applied to the gate of the fourth transistor T4 whilst its logic inverse $\overline{CK}$ is applied to the gate of the first transistor T1. The detection signal $S_A$ is applied simultaneously to the respective gates of the second and third transistors T2, T3, whilst the junction point of the source of the second transistor T2 and of the source of the third transistor T3 is connected to the inverting input V− of the differential amplifier 2.

When the clock signal CK is at the high logic level, the transistors T4 and T1 are on. The output $S_A$ of the differential amplifier 2 is then connected to its inverting input V− and the differential amplifier 2 is thus in a follower configuration. The output voltage $S_A$ is then substantially equal to the product of the voltage V+ times the ratio K/K+1), where K is the gain of the differential amplifier 2. Now, since K is generally much greater than 1, the signal Sa is substantially equal to the voltage V+ corresponding to the reference column. This follower configuration is maintained during the preloading cycle operated by a control logic internal to the memory. On completion of this preloading cycle, the switch 4 is then placed in the open position, resulting in a high impedance between the inverting input V− and the output of the differential amplifier 2 which then completely fulfils its role as comparator since it is no longer under feedback.

Moreover, it should be noted that with the invention there is no risk of instability and of oscillation during the preloading operation since the feedback gain is equal to 1. The differential amplifier 2 then behaves as a follower stabilized by negative loop-back.

Furthermore, with the prior-art detection devices, owing to the inevitable asymmetries existing between the input transistors of the differential amplifier, a short-circuiting of the two inputs of the differential amplifier could cause a false reading, either of a 1 or of a 0. With the device according to the invention, the use of the amplifier itself for the balancing causes automatic compensation of the aforesaid imbalance between input transistors, and the inputs of the differential amplifier are then biased to the amplifier's changeover point.

Figure 3:
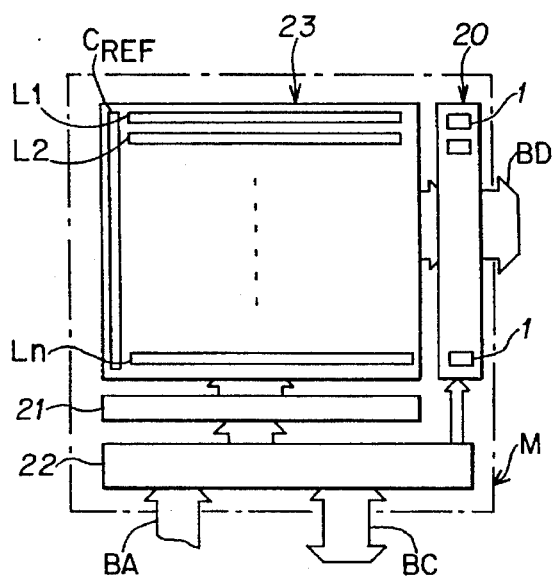
FIG. 3 is an overall view of the organization of a memory incorporating the device according to the invention.

An erasable programmable permanent memory M of EPROM type incorporating detection devices according to the invention, a very simplified illustrative structure of which is represented in FIG. 3, incorporates a set 23 of memory cells organized as bit lines L1, L2, Ln with which a reference column $C_{REF}$ is associated. A control and interface logic 22 processes the address cues received on an address bus BA and control cues exchanged on a control bus BC. An address decoding logic provides for the pointing to the bit line relating to a read operation whilst a detection logic 20 incorporates a set of detection devices 1 according to the invention which generate read cues which are then delivered onto a databus BD. It should be noted that the combination of the addressing, control and interfacing operations can be carried out according to the customary techniques well known in the area of microelectronics.

Of course, the invention is not limited to the examples which have just been described and other contrivances and extensions may be envisaged without departing from the scope of the invention. Thus, the switch allowing the selective connecting of the output and of the inverting input of the differential amplifier may be made in many ways other than that which has just been described. Furthermore, the present invention can be applied to any present or future semiconductor technology so long as it involves detecting a logic cue within a memory by implementing a differential amplifier.

What is claimed is:

1. A device for detecting the content of cells of a memory, especially an EPROM memory, the cells being organized as a set of bit lines, comprising comparison means for comparing a reference current associated with a reference column and a read current invoked in a cell of a bit line, said comparison means including a resistive reference element and a resistive read element through which said reference and read currents respectively travel, and which are connected at a first end to a supply voltage source and at a second end to a non-inverting input and an inverting input respectively of a differential amplifier, the differential amplifier delivering as output a detection signal, the device further comprising connecting means for selectively connecting the output of the differential amplifier to its inverting input for a predetermined preloading period.

2. A device as claimed in claim 1, wherein the connecting means comprise switching means controlled by a cyclic preloading clock signal.

3. A device as claimed in claim 2, further comprising high-impedance amplification means placed downstream of the differential amplifier for generating, from the detection signal output by said differential amplifier, a read logic cue.

4. A method for detecting data content of a cell in a memory, especially an EPROM memory, having cells organized as a set of bit lines, the memory having a reference current, the cell having a read current indicative of data content, in a device having a differential amplifier, the method comprising the steps of:

preloading the device;

reading the contents of the cell by comparing the read current with the reference current using the differential amplifier; and switching the differential amplifier into follower mode in the preloading step.

5. A method as claimed in claim 4, wherein, during the preloading clock cycle, the output of the differential amplifier is connected to the inverting input of said differential amplifier.

6. An erasable permanent memory, especially of the EPROM type having a plurality of cells organized as a set of bit lines, comprising:

comparison means for comparing a reference current associated with a reference column and a read current invoked in a cell of a bit lines, said comparison means including a differential amplifier with an inverting input, a non-inverting input and an output, a resistive reference element and a resistive read element through which said reference current and said read current respectively travel, said resistive reference element and said resistive read element connected at a first end to a supply voltage source and at a second end to the non-inverting input and to the inverting input respectively, said differential amplifier delivering to the output a detection signal;

connecting means for selectively connecting the output of the differential amplifier to the inverting input for a predetermined preloading period; and control means for generating, in the course of a preloading clock cycle, a signal for operating the connecting means.

7. An erasable permanent memory, especially of the EPROM type, having a plurality of cells organized as a set of bit lines, comprising:

means for reading a cell including comparison means for comparing a reference current associated with a reference column and a read current invoked in a cell of a bit line, said comparison means including a differential amplifier with an inverting input, a non-inverting input and an output, and including a resistive reference element and a resistive read element through which said reference current and said read current respectively travel, said resistive elements connected at a first end to a supply voltage and at a second end to the non-inverting input and to the inverting input respectively, said differential amplifier delivering to the output a detection signal; and connecting means for selectively connecting the output of the differential amplifier to the inverting input for a predetermined preloading period.

8. A device for detecting data content of a cell of a memory, the cell having a read current source for sourcing a current indicative of cell data content, comprising:

a differential amplifier having an output, a non-inverting input and an inverting input;

a resistive reference element having a first reference end connected to a supply voltage source and a second reference end connected to a reference current source and to the non-inverting input;

a resistive read element having a first read end connected to a supply voltage source and a second read end connected to a read current source and to the inverting input; and connecting means for periodically connecting the output of the differential amplifier to its inverting input for a predetermined period.

9. A device as claimed in claim 8, wherein the connecting means includes four series-connected semi-conductor switches.

10. A method for detecting data content of a cell in a memory, the memory having a reference current, the cell having a read current indicative of cell data content, in a device having a differential amplifier with an output, a non-inverting input and an inverting input, the method comprising the steps of:

switching a differential amplifier into a follower mode by connecting the output of the differential amplifier to the inverting input during a first predetermined period of time;

disconnecting the output of the differential amplifier from the inverting input during a second predetermined period of time to operate the differential amplifier as a comparator; and applying the read current to the inverting input and the reference current to the non-inverting input during the second period of time to compare the read current with the reference current and obtain the data content of the cell.

11. A method as claimed in claim 10, wherein the first predetermined period of time is initiated by a cyclic clock signal.

12. A method as claimed in claim 10, wherein the second predetermined period of time is initiated by a cyclic clock signal.

13. An erasable permanent memory, comprising:

a plurality of cells organized as a set of bit lines, each row having a read current source;

a reference column including at least one reference current source;

a plurality of devices, each device connected to one of said bit lines, each device including a differential amplifier having an output, a non-inverting input and an inverting input, a resistive reference element having a first reference end connected to a supply voltage source and a second reference end connected to a reference current source and to the non-inverting input, and a resistive read element having a first read end connected to a supply voltage source and a second read end connected to a read current source and to the inverting input; and means for connecting the output of each differential amplifier to its inverting input for a predetermined period.

* * * * *